United States Patent [19]

Terakado et al.

[11] Patent Number: 5,254,215
[45] Date of Patent: * Oct. 19, 1993

[54] DRY ETCHING METHOD

[75] Inventors: Shingo Terakado; Osamu Kitamura, both of Tsukuba, Japan

[73] Assignee: Sanyo Electric Co., Ltd., Osaka, Japan

[*] Notice: The portion of the term of this patent subsequent to Feb. 2, 2010 has been disclaimed.

[21] Appl. No.: 792,221

[22] Filed: Nov. 12, 1991

Related U.S. Application Data

[63] Continuation-in-part of Ser. No. 565,264, Aug. 9, 1990, Pat. No. 5,183,531.

[30] Foreign Application Priority Data

| | | |
|---|---|---|
| Aug. 11, 1989 [JP] | Japan | 1-208095 |
| Mar. 27, 1990 [JP] | Japan | 2-77944 |
| Apr. 25, 1990 [JP] | Japan | 2-109110 |
| Mar. 27, 1991 [JP] | Japan | 3-90029 |
| May 23, 1991 [JP] | Japan | 3-147933 |

[51] Int. Cl.$^5$ .................................... H01L 21/00
[52] U.S. Cl. ........................... 156/643; 156/646; 156/662; 156/667; 156/664; 156/654
[58] Field of Search ............ 156/643, 345, 646, 662, 156/667, 664, 654

[56] References Cited

U.S. PATENT DOCUMENTS 4,941,942 7/1990 Bruns et al. ............ 156/657

FOREIGN PATENT DOCUMENTS 0175561 3/1986 European Pat. Off. .
0217921 8/1989 Japan .

OTHER PUBLICATIONS

"Physics of the Atom"; by Wehr et al., ®1978; Reading, Mass.; Addison-Wesley Co.; pp. 207-214.
"Synchrotron Radiation-Assisted Etching of Silicon Surface" by Nobuo Hayanaka et al; Jap. Jr. of Applied Physics; vol. 26, No. 7, Jul., 1987, pp. 1.1110-1.1112.

*Primary Examiner*—Brian E. Hearn
*Assistant Examiner*—George Goudreau
*Attorney, Agent, or Firm*—Spensley Horn Jubas & Lubitz

[57] ABSTRACT

A dry etching method capable of performing fine patterning. A sample substrate is fixedly disposed on a table in a reactant chamber. Gas plasma produced by a gas plasma generator is introduced into the reactant chamber, and excitation light, that is, light capable of exciting inner shell electrons of constituent atoms of the substrate, is irradiated onto the substrate from above the substrate. In the optical path of the excitation light is disposed a mask. The substrate is irradiated with the light in response to a pattern designated by the mask. The excitation light has an energy for exciting electrons of constituent atoms of the substrate. Upon arrival of the light in etched regions, the electrons of the substrate are excited. As a result, etching is effected by the contact of the excited electrons with the gas plasma, and the rate of this etching is greatly enhanced. Since the electrons of the substrate in masked areas are not excited, the masked areas become hardly subjected to etching by the contact of the gas plasma, whereby the pattern of the mask is transferred to the substrate with high accuracy, whereby fine patterns are formed.

12 Claims, 7 Drawing Sheets

FIG. I

F I G. 4
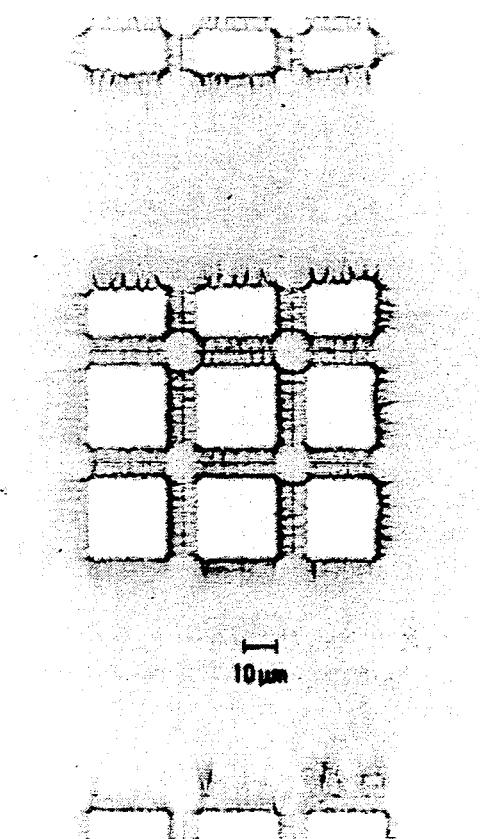
10μm

F I G. 6
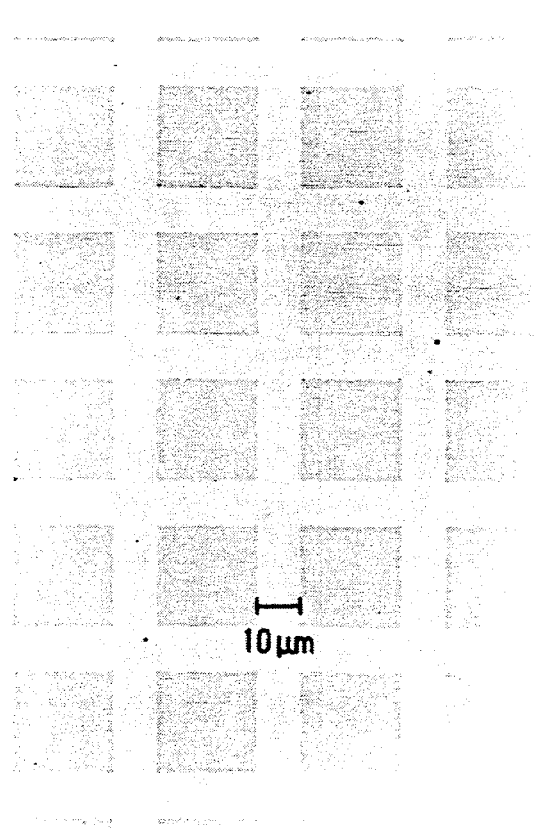
10μm

DRY ETCHING METHOD

This is a continuation in part of application Ser. No. 07/565,264 filed Aug. 9, 1990, now Pat. No. 5,183,531.

BACKGROUND OF THE INVENTION

1. Field of the Invention

This invention relates to a dry etching method for manufacturing semiconductor devices.

2. Description of the Related Art

Etching has been hitherto known as a technique used in the fabrication of semiconductor devices, and several etchings techniques are developed. Among these techniques, reactive ion etching (hereinafter known as RIE) has been widely employed in the field of anisotropic etch which utilizes gases in the plasma state including fluorine compounds or chlorine compounds. Such a technique is described in "Applied Physics" in 1984, vol. 53, No. 10, pp. 867.

As advancements have been made in the high integration of semiconductor devices, the more reduction in size is demanded in fabrication, the more severe the requirements become. Accordingly, there have been requested improvements in both directionality in RIE and the alleviation of damage to the devices due to etching. In particular, in the case of RIE, since the radiation of highly energized ions towards a substrate determines the accuracy of the directionality, the more the energy of ions increases, the more the collisions of the ions against the substrate develop, thereby impairing the substrate.

A decrease in the energy of ions may alleviate the aforementioned damage due to etching, but it will result in less anisotropic etching, in other words, less directional etching. Therefore, it can be said that the energy of ions in RIE is specified by the balance between the damage to the substrate and the accuracy of anisotropy in etching, hindering a further improvement in the accuracy of etching. This is referred to in a journal entitled "Semicon NEWS" October, 1981, pp. 31.

Accordingly, attention is now directed towards an optical chemical reaction process which utilizes optical excitation without the use of charged particles (ions). Specifically, in the optical chemical reaction process, reactive gas molecules are transformed into free radicals by means of optical energy, and the reaction of the free radicals with the substrate creates reactive products. Etching is accomplished by knocking out substrate atoms with the free radicals. By virtue of such etching utilizing the optical chemical reaction, damage to the substrate due to etching can be reduced to a minimum.

However, in etching employing a conventional optical chemical reaction, gases are activated by the optical chemical reaction and etching is effected by a simple reaction, i.e., the contact of the activated gases with the substrate. If the activated gases attack optically non-irradiated regions, the regions will be etched, thereby producing an undercut of the substrate. Compared with RIE, etching employing the optical chemical reaction is inferior in its slower reaction rate and etch rate.

Furthermore, in etching using the conventional optical chemical reaction, a low-pressure mercury lamp is used as a light source, and the light wavelength there of is in the range longer than about 100 nm. The use of such light causes diffraction during the radiation, impeding the accurate transfer of a mask pattern onto the substrate. Etching utilizing the optical chemical reaction is described in a journal entitled "SURFACE CHEMICAL" in 1984, vol. 5, No. 4, pp. 435.

SUMMARY OF THE INVENTION

This invention is directed at overcoming the foregoing drawbacks in the conventional techniques, and an object of the invention is to provide a dry etching method for precisely patterning a substrate with less undercut, damage and adverse effects due to the diffraction.

To this aim, according to one aspect of this invention, there is provided a dry etching method comprising the steps of introducing reactive gases activated by microwaves into a reactant chamber; and selectively etching regions optically irradiated on a substrate to be etched, which is disposed in the reactant chamber, by the radiation of light. The light includes light at a wavelength to excite inner shell electrons of constituent atoms of the substrate. The substrate consists of silicon (Si), and soft X-rays having the wavelength of 10 nm or less are irradiated to the substrate as excitation light. Alternatively, the substrate may be made of silicon carbide (SiC), and soft X-rays having the wavelength of 10 nm or less are irradiated to this substrate. Consequently, the use of soft X-rays to excite the electrons of atoms of the substrate enables selective etching of target regions with high directionality.

According to this invention, the light to be irradiated to the substrate is selected so as to be able to excite constituent atoms of the substrate such as inner-shell electrons of silicon (Si). Moreover, the reactive gases are introduced into the reactant chamber after having been activated by microwaves. As a result, the excited electrons of the constituent atoms of the substrate react with species generated by the microwaves, resulting in an effective etching reaction.

Accordingly, when compared with the simple reaction between the activated species and the substrate, the etch rate is improved. In some combinations of gas and a substrate, upon arrival of the activated species, on the substrate, which is produced by means of the photochemical process or microwaves, the etching reaction may be promoted. Even in the case where there is a change in the combination of the gas or a substrate and change in conditions such as gas pressure, temperature, or the like, the etching reaction will never be commenced solely by the arrival of the activated species.

The excitation of electrons of constituent atoms is merely performed in the regions to be irradiated by the light, and the etching is restricted exclusively to the irradiated regions on the substrate, thereby preventing the occurrence of undercut and the like. Yet, if a high energy light having the capacity of exciting the electrons of constituent atoms is used, the wavelength of the light is much reduced, eliminating the occurrence of inaccurate definition due to diffraction.

Still another advantage is that since the radiation of this type of light requires the substrate and a noncontact mask, several of the processes such as spraying and stripping or the like can be disregarded, and one mask may be used repeatedly many times.

Furthermore, in the case of Si and SiC substrates, optimum etching can be attained with the use of light having energy of about 100 eV or more, that is, with a wavelength of 12.5 nm or less.

According to this invention, in a dry etching method in which the directionality and selectivity are critical factors, it is possible to effect etching in target regions with high directionality and selectivity along the direction of light radiation by the excitation of electrons of constituent atoms.

This invention refers to an etching method making use of light and activated species, which are produced at the plasma generator isolated from a sample, and it is possible to solve the drawbacks of damage due to high energy charged particles because the particles do not contribute to etching.

Further, according to this invention, the etch rate is enhanced by the activation of gases with the introduction of microwaves as compared with the case in which the gases are activated by light. Specifically, it becomes possible to realize etching at a high etch rate with the directionality maintained and without producing damage due to the charged particles.

Moreover, it becomes possible to produce fine patterns with the effects of diffraction suppressed.

BRIEF DESCRIPTION OF THE DRAWINGS

Still further objects and advantages of the invention will be apparent from the following detailed description and appended claims and from the accompanying drawings illustrative of the invention wherein:

FIG. 4 is a microphotograph showing a crystalline structure representing an etched pattern of the silicon substrate produced using light having a wavelength in the range between about 1.6-100 nm as an excitation light source;

FIG. 6 is a microphotograph showing an etched pattern of a silicon carbide substrate obtained using light having a wavelength in the range between about 0.6-100 nm as the excitation light source;

DETAILED DESCRIPTION OF THE EMBODIMENTS

Figure 1:
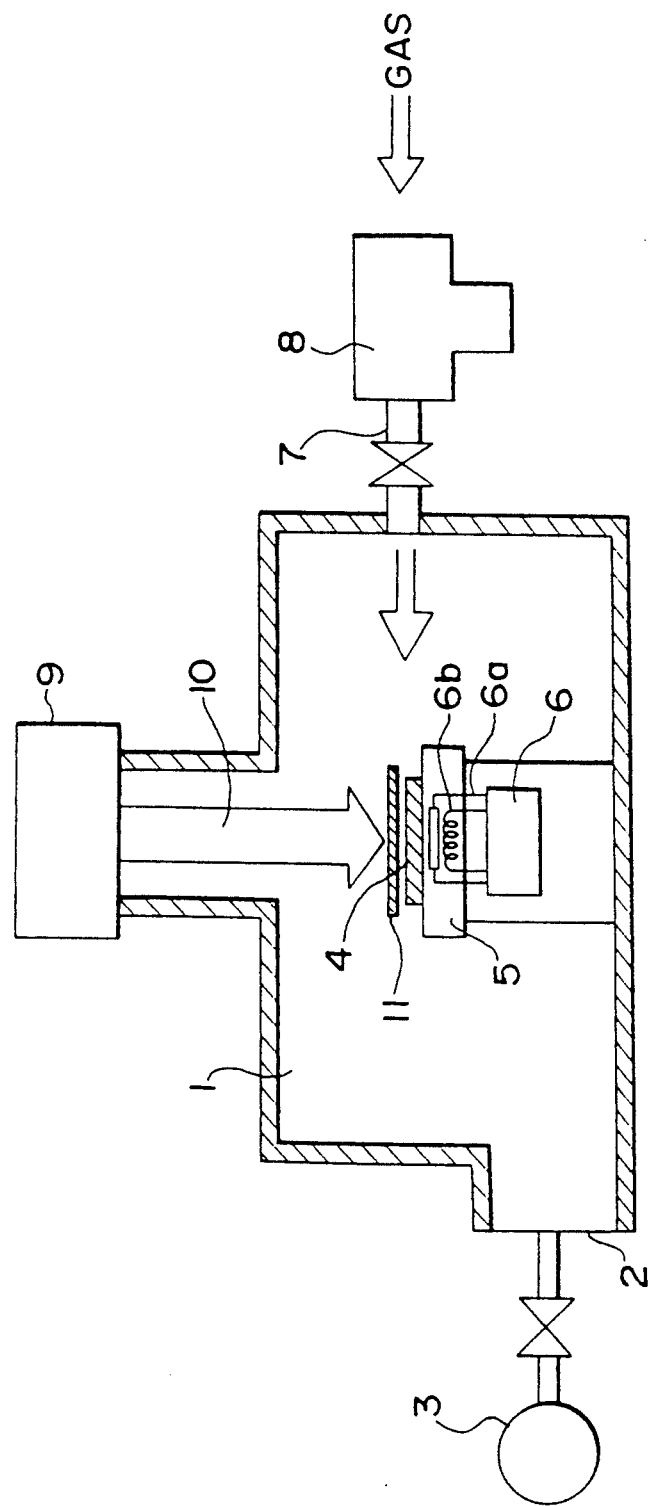
FIG. 1 is a cross sectional plan view of apparatus for carrying out a dry etching method according to one embodiment of the present invention.
Figure 2:
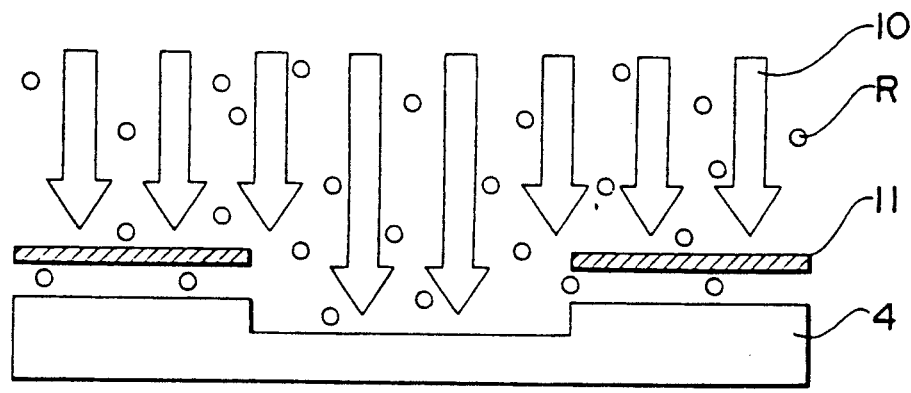
FIG. 2 is a schematic representation illustrating an etched state substrate.

With reference to FIG. 1 of the accompanying drawings, apparatus for carrying out the dry etching method according to this invention will be explained hereinbelow. In a reactant chamber 1 an outlet 2 is provided, and a vacuum pump 3 enables ventilation of the chamber through the outlet 2 while maintaining the reduced pressure of the chamber. Ordinarily, the pressure of the reactant chamber 1 is maintained within $10^{-7}$-$10^{-8}$ Torr before the etching operation commences.

A substrate 4 is fixedly disposed on a table 5. This table 5 includes a cooling system 6a and a heater 6b for controlling the temperature of the chamber within the range between −140° and 300° C.

The reactant chamber 1 further includes an inlet 7 connected thereto, and reactive gases are supplied through this inlet. With the above structure, the reactive gases supplied through the inlet 7 are evacuated from the outlet 2 via the reactant chamber 1. In the inlet 7, there is provided a gas plasma generator 8 utilizing microwaves at a frequency of 2.45 GHz.

The reactive gases, for example, $SF_6$ and Argon (Ar) are excited in the gas plasma generator 8 and introduced into the reactant chamber 1 in the form of activated species, i.e. etchant species.

Excited light 10 is radiated from a light source 9 disposed on the ceiling of the chamber 1. A mask 11 is interposed in an optical path between the light source 9 and the substrate 4. This mask 11 collimates the light 10 into beams having a desired pattern, and the beams are irradiated only onto a specific target region on the substrate 4. A mask made from stainless steel, for instance, is used as the mask 11.

Throughout experiments exemplified hereunder, there have been used an Ebeson type cavity manufactured by Ebic Co. Ltd. with serial No. 214L and a power supply manufactured by the same with serial No. MR-301.

The substrate 4 is fixedly positioned on the table 5, and various conditions are selected before carrying out etching with the use of the aforementioned apparatus. After the selection of conditions, a portion of the excitation light 10, having passed through the mask 11 is directed onto the substrate 3, thereby exciting the electrons of the constituent atoms 4. Upon contact of radicals R of the reactive gases onto the region at which the electrons of the substrate 4 are excited, etching is promoted only in this region.

In the regions not irradiated by the light 10, however, no electrons are excited. Accordingly, in this region, the contact of the radicals R of the reactive gases with the substrate does not lead to an etching reaction as it does in the irradiated regions. In consequence, it is possible to effect fast and highly accurate etching without producing unwanted undercut. Furthermore, since the light for exciting the electrons of the constituent atoms of the substrate 4 has a short wavelength, no diffraction of light occurs due to the mask 11.

Following are exemplified experiments of etching conducted with the use of the above-mentioned devices. The depth of etch was measured by the use of a surface roughness tester. The maximum measuring capacity of this tester is approximately 5 nm.

EMBODIMENT 1: SILICON SUBSTRATE ETCHING

[Embodiment 1-1]

1. Substrate: n-type silicon ((100), $\rho$=22-28 $\Omega$ cm)
2. Sample temperature: 25° C.
3. Reactive gases: $SF_6$ and Ar
4. Gas pressure (pressure measured in the vicinity of the substrate in the reactant chamber):
   $SF_6$ pressure . . . 0.04 Torr
   Ar pressure . . . 0.5 Torr
5. Output power of microwaves in the gas plasma generator: 15W
6. Excitation light: Successive light having a wavelength in the range of about 1.6-100 nm
7: Dose of excitation light: 60,000 min·mA
8. Mask: Nickel mesh (line width: space width=8 μm: 24 μm)

9. Gap: 380 μm

The experiment performed under the conditions set forth in the above resulted in etching with a peak-to-valley height as shown in FIG. 4. Thus, adverse effects due to the diffraction of light are reduced with the use of the light having a short wavelength, thereby producing a proper pattern.

[Embodiment 1-2]

6. Excitation light: continuous light having a wavelength of 9.5 nm (E=130 eV) where the relationship between the energy of light (E (eV)) and the wavelength ($\gamma$ (nm)) is expressed by $\gamma$ (nm)=1240/E (eV).
10. Photoelectron current of gold: 2.69 nA Here, the photoelectron current of gold is the current measured when the excitation light is irradiated onto gold. Conventionally, the quantity of electrons emitted from gold is considered constant in the energy range of this experiment. This experiment was carried out under the same conditions as the first experiment except the above two factors and resulted in etching having a peak-to-valley height of approximately 1,100 nm.

[Embodiment 1-3]

6. Excitation light: continuous light having a wavelength of 14.6 nm (E=85 eV)
10. Photoelectron current of gold: 1.85 nA This experiment was carried out under the same conditions as the first experiment except the above two factors and resulted in etching having a peak-to-valley height of approximately 250 nm.

[Embodiment 1-4]

6. Excitation light: 24.8 nm (E=50 eV)
10. Photoelectron current of gold: 0.51 nA This experiment was carried out under the same conditions as the first experiment except the above two factors and resulted in etching having a peak-to-valley height of approximately 100 nm.

Table 1 shows the analysis of the embodiments 1-2 through 1-4. Here, a quantum reaction efficiency is a division of the etch height by the photoelectron current of gold.

TABLE 1

|  | Peak-to-valley height (nm) | Photoelectron current of gold (nA) | Quantum reaction efficiency (nm/nA) |
| --- | --- | --- | --- |
| 1-2 (9.5 nm) | 1,100 | 2.69 | 409 |
| 1-3 (14.6 nm) | 250 | 1.85 | 135 |
| 1-4 (24.8 nm) | 100 | 0.51 | 196 |

Figure 3:
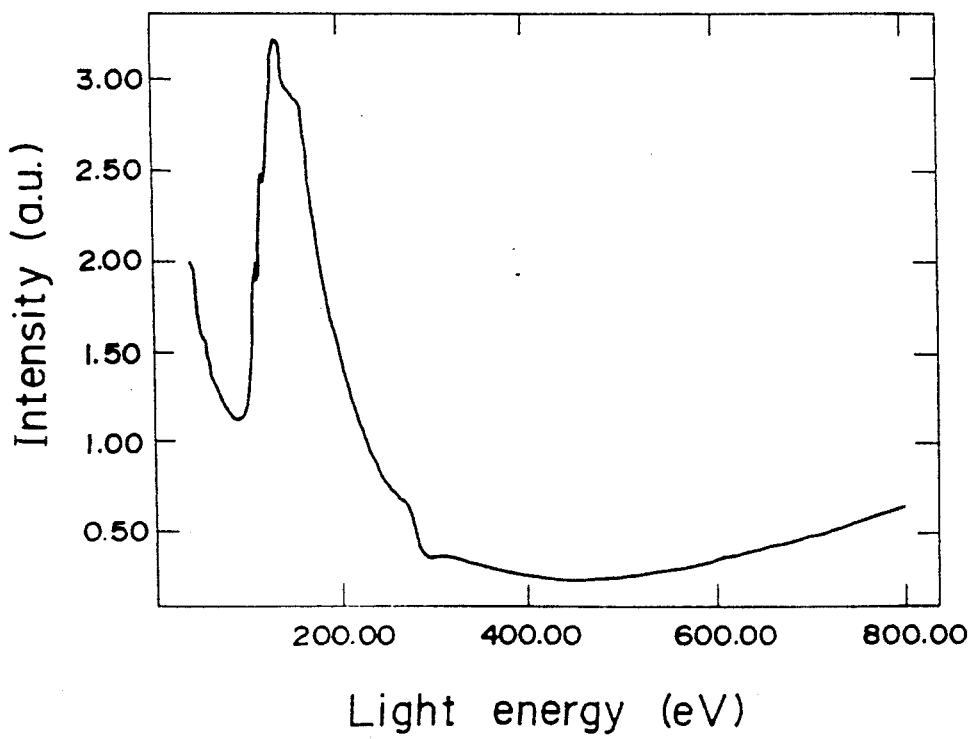
FIG. 3 is a graph showing a spectrum of a total electron yield of a silicon substrate at an energy in the range of 1.6 to 31 nm, (E=40-800 eV)

FIG. 3 illustrates a spectrum of total electron yield of the Si substrate exposed in plasma for 10 minutes at the reactive gas pressure SF$_6$/Ar=40/500 mTorr, and at the microwave output power of 15W.

The total electron yield is a current value obtained by the radiation of the excitation light onto the substrate standardized by the current value of gold.

The table 2 shows the ratio of the quantum reaction efficiency on the basis of the embodiment 1-3 and the ratio of total electron yield in FIG. 3.

TABLE 2

|  | Ratio of quantum reaction efficiency | Total electron yield |
| --- | --- | --- |
| Embodiment 1-2 | 3.0 | 2.8 |
| Embodiment 1-3 | 1 | 1 |
| Embodiment 1-4 | 1.5 | 1.5 |

The total electron yield shows its peak in the embodiment 1-2 conducted with the use of light of 130 eV because of the excitation of L shell electrons of the Si substrate. The L shell absorption edge of the Si substrate is about 12.5 nm (approximately 100 eV).

Since the ratios of the quantum reaction efficiency and the total electron yield are coincident with each other, it may be said that the spectrum of total electron yield is a reflection of the quantum reaction efficiency. Accordingly, it turned out that the radiation of light having the capacity to excite the L shell electrons of the Si substrate is effective.

Although it will be foreseeable from FIG. 3 that the use of light having a wavelength longer than 31 nm results in an increase in the total electron yield, it is not desirable to utilize light having a wavelength longer than 31 nm in view of the diffraction effect. Therefore, in the case of light having a short wavelength, it is favorable to utilize light having the wavelength capable of exciting the inner shell electrons of the Si substrate.

Since the use of light capable of producing high etch rates is proven to be effective, light having a high quantum reaction efficiency of 5.9–12.4 nm (E=100–210 eV) is most suitable for use in etching the Si substrate.

Comparative Examples

Following are comparative examples in which etching is effected with the use of light having a wavelength other than that specified in the aforementioned embodiments.

Figure 5:
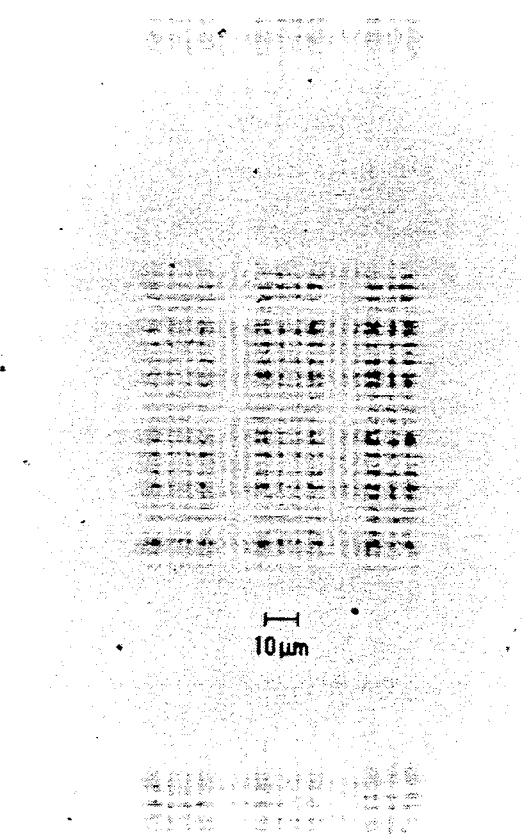
FIG. 5 is a microphotograph showing a crystalline structure representing an etched pattern of the silicon substrate produced using light having a wavelength in the range between about 35 to 200 nm as the excitation light source.

FIG. 5 is a schematic representation of a pattern obtained from an experiment conducted with the use of a continuous light having a wavelength of about 35 to 200 nm as the excitation light under the same conditions as the embodiment 1. As can be seen, stripe patterns appeared due to the diffraction of light.

[Embodiment 1-5]

1. Substrate: n-type Si (100)
2. Sample temperature: 25° C.
3. Reactive gases: Sulfur hexafluoride (SF$_6$) and Argon (Ar)
4. Gas pressure (gas pressure measured in the vicinity of the sample in the reaction chamber):
   SF$_6$ ... 0.05 Torr
   Ar ... 0.5 Torr
5. Output power of microwaves (in the gas plasma generation section): 30W
6. Excitation light: VUV having a wavelength between 35 and 100 nm
7. Dose of excitation light: 7,500 min·mAmp. (66 min)
8. Mask: Stainless stencil (line width: space width=50 μm:100 μm)
9. Distance between the mask and the substrate: 0.3 mm This experiment was carried out under the conditions set forth in the above and resulted in etching as follows.

|  | Etched regions | Unetched mesa areas |
| --- | --- | --- |
| Etch rate | approx. 10.6 nm/min | approx. 7.6 nm/min |
| Peak-to-valley height | approx. 700 nm | approx. 500 nm |

[Embodiment 1-6]

1. Substrate sample: n-type Si (100)
2. Sample temperature: 25° C.
3. Reactive gases: Sulfur hexafluoride (SF$_6$) and Argon (Ar)
4. Gas pressure (gas pressure measured in the vicinity of the sample in the reactant chamber):
   SF$_6$ ... 0.01 Torr
   Ar ... 0.5 Torr
5. Output power of microwaves (in the gas plasma generation section): 15W
6. Excitation light: VUV having a wavelength between 35 and 100 nm
7. Dose of light: 10,000 min·mAmp. (54 min)
8. Mask: Stainless stencil (line width:space width=50 μm:100 μm)
9. Distance between the mask and the substrate: 0.3 mm.

This experiment was carried out under the conditions set forth in the above and resulted in etching as follows.

|  | Etched regions | Unetched mesa areas |
| --- | --- | --- |
| Etch rate | approx. 5.6 nm/min | approx. 0.6 nm/min |
| Peak-to-valley height | approx. 300 nm | approx. 30 nm |

[Embodiment 1-7]

1. Substrate sample: n-type Si (100)
2. Substrate temperature: −120° C.
3. Reactive gases: Sulfur hexafluoride (SF$_6$) and Argon (Ar)
4. Gas pressure (gas pressure measured in the vicinity of the sample in the reactant chamber):
   SF$_6$ ... 0.05 Torr
   Ar ... 0.5 Torr
5. Output power of microwaves (in the gas plasma generation section): 30W
6. Excitation light: VUV having a wavelength between 35 and 100 nm
7. Dose of light: 20,000 min·mAmp. (107 min)
8. Mask: Stainless stencil (line width:space width=50 μm:100 μm)
9. Distance between the mask and the substrate: 0.3 mm This experiment was carried out under the conditions set forth in the above and resulted in etching as follows.

|  | Etched regions | Unetched mesa areas |
| --- | --- | --- |
| Etch rate | approx. 0.7 nm/min | approx. 0.5 nm/min |
| Peak-to-valley height | approx. 100 nm | approx. 50 nm |

EMBODIMENT 2: SILICON CARBIDE SUBSTRATE ETCHING

[Embodiment 2-1]

1. Substrate sample: SiC
2. Sample temperature: 25° C.
3. Reactive gases: Sulfur hexafluoride (SF$_6$) and Argon (Ar)
4. Gas pressure (gas pressure measured in the vicinity of the sample in the reactant chamber):
   SF$_6$ ... 0.01 Torr
   Ar ... 0.5 Torr
5. Output power of microwaves (in the gas plasma generation section): 30W
6. Excitation light: VUV having a wavelength between 0.6-100 nm
7. Dose of light: 20,000 min·mAmp. (379 min)
8. Mask: Nickel mesh (line width:space width=10 μm:40 μm)
9. Gap: 300 μm.

This experiment was carried out under the conditions set forth in the above and resulted in the production of the pattern shown in FIG. 6. Thus, the use of light having a wavelength in a shortwave range can alleviate the adverse effects due to the diffraction of light, whereby it becomes possible to produce an accurate pattern.

[Embodiment 2-2]

6. Excitation light: approximately 9.5 nm (E=130 eV)
7. Dose of light: 100,000 min·mA (379 min)
8. Mask: Stainless stencil (line width:space width=approx. 50 pm: approx. 100 μm)

This experiment was carried out under the same conditions as the embodiment 2-1 except for the above three factors and resulted in etching having a peak-to-valley height of approximately 13 nm.

[Embodiment 2-3]

6. Excitation light: approximately 11.3 nm (E=110 eV)
7. Dose of light: 100,000 min·mA (385 min)
8. Mask: Stainless stencil (line width:space width=approx. 50 μm: approx. 100 μm)

This experiment was carried out under the same conditions of the embodiment 2-1 except for the above three factors and resulted in etching having a peak-to-valley height of approximately 10 nm.

[Embodiment 2-4]

6. Excitation light: approximately 14.6 nm (E=85 eV)
7. Dose of light: 100,000 min·mA (335 min)
8. Mask: Stainless stencil (line width:space width=approx. 50 μm: approx. 100 μm)

This experiment was carried out under the same conditions as the embodiment 2-1 except for the above three factors and resulted in etching having a peak-to-valley height of approximately 5 nm.

Table 4 shows results of the embodiments 2-2 through 2-4.

TABLE 4

| | Peak-to-valley height (nm) | Etch rate (nm/min) | Photoelectron current of gold (nA) | Quantum reaction efficiency (nm/nA) |
| --- | --- | --- | --- | --- |
| 2-2 (9.5 nm) | 13 | 0.034 | 2.69 | 4.8 |
| 2-3 (11.3 nm) | 10 | 0.026 | 2.69 | 3.7 |
| 2-4 (14.6 nm) | 5 | 0.015 | 1.85 | 2.7 |

Figure 7:
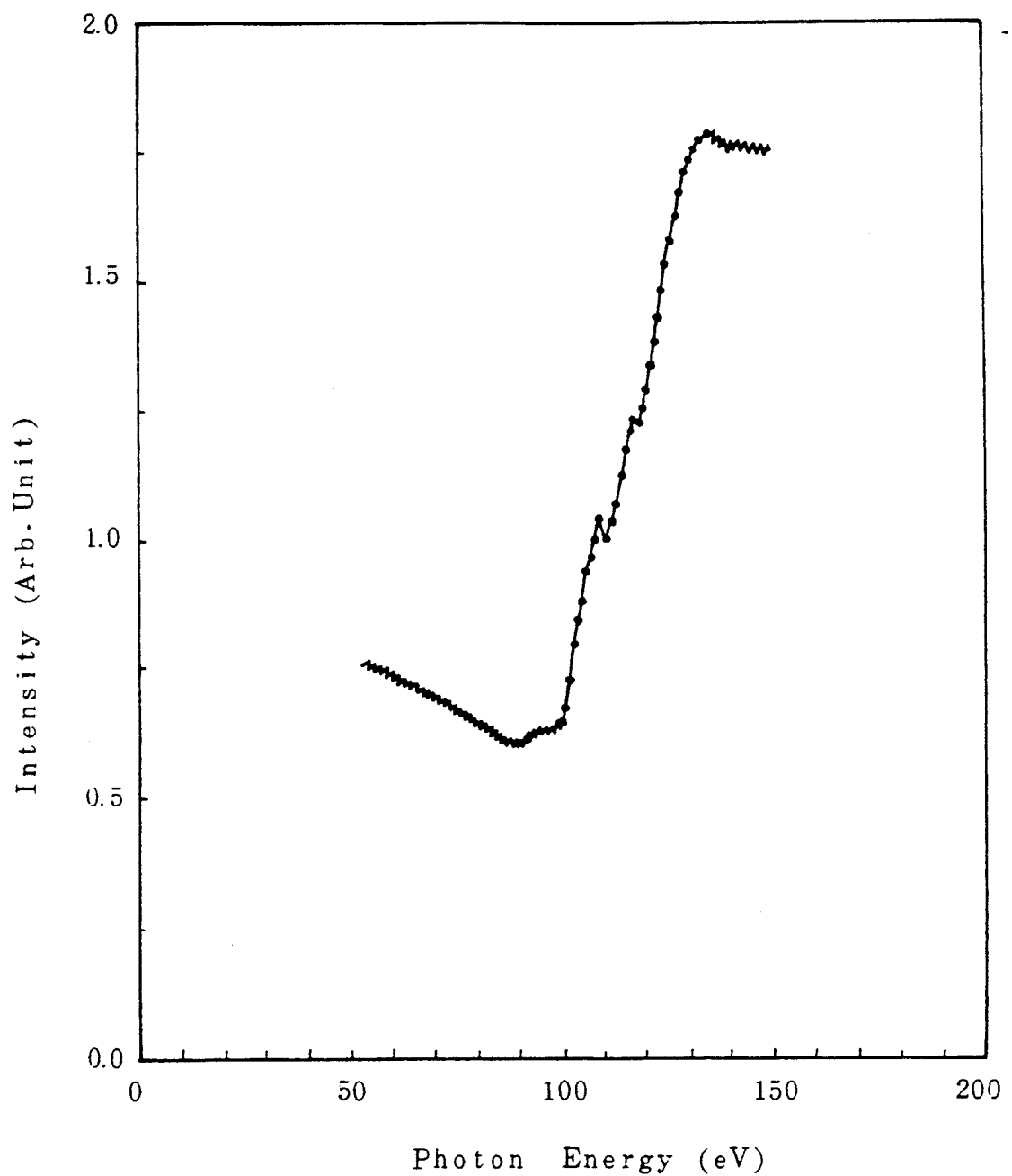
FIG. 7 is a graph showing a spectrum of total electron yield of the silicon carbide at an energy in the range between 8.3-24.8 nm (E=50-150 eV)

FIG. 7 shows the spectrum of total electron yield (E=50 ev-150 eV) measured in the proximity of the L shell absorption edge of Si of the SiC substrate. Table 5 describes the ratio of quantum reaction efficiency on the basis of the embodiment 2-4 and the ratio of the total electron yield shown in FIG. 7.

TABLE 5

| | Ratio of quantum reaction efficiency | Ratio of total electron yield |
| --- | --- | --- |
| Embodiment 2-2 | 1.8 | 2.8 |
| Embodiment 2-3 | 1.4 | 1.6 |
| Embodiment 2-4 | 1 | 1 |

The total electron yield shows its peak in the embodiment 2-2 conducted with the energy of 130 eV because of the excitation of L shell electrons of Si, i.e. constituent atoms of Sic. From the embodiments, the L shell absorption edge of Si, that is, a binding energy, turned to be about 12.5 nm (100 eV). The embodiment 2-1 resulted in an increase in etch rate to about twice that of the embodiment 2-4. In addition, since the ratio of quantum reaction efficiency and the ratio of total electron yield exhibit a similar tendency, it turned out that the spectrum of total electron yield is a reflection of the quantum reaction efficiency. Accordingly, it can be understood that the radiation of light capable of exciting L shell electrons of Si, namely, the radiation of light including an L shell absorption edge band or an energy band barely higher than the energy of the absorption edge is necessary in order to improve the etch rate.

Following are embodiments conducted with the radiation of light of approximately 4.4 nm wavelength or thereabouts (about 285 eV), i.e., the light absorption edge of K shell electrons of constituent atoms C of the substrate.

[Embodiment 2-5]

6. Excitation light: approximately 4.3 nm (E=290 eV)
7. Dose of light: 160,000 min·mA (523 min)
8. Mask: Stainless stencil (line width:space width approx. 50 μm: approx. 100 μm)

This experiment was carried out under the same conditions as the embodiment 2-1 except for the above three factors and resulted in etching having a peak-to-valley height of approximately 12 nm.

[Embodiment 2-6]

6. Excitation light: approximately 5 nm (E=250 eV)
7. Dose of light: 60,000 min·mA (522 min)
8. Mask: Stainless stencil (line width:space width approx. 50 μm: approx. 100 μm)

This experiment was carried out under the same conditions of the embodiment 2-1 except the above three factors and resulted in etching having a peak-to-valley height of approximately 6 nm.

Table 6 describes the results of the embodiments 2-5 and 2-6.

TABLE 6

| | Peak-to-valley height (nm) | Etch rate (nm/min) | Photoelectron current of gold (nA) | Quantum reaction efficiency (nm/nA) |
| --- | --- | --- | --- | --- |
| 2-5 (4.3 nm) | 12 | 0.023 | 1.19 | 10.1 |
| 2-6 (5 nm) | 6 | 0.011 | 1.23 | 4.9 |

Figure 8:
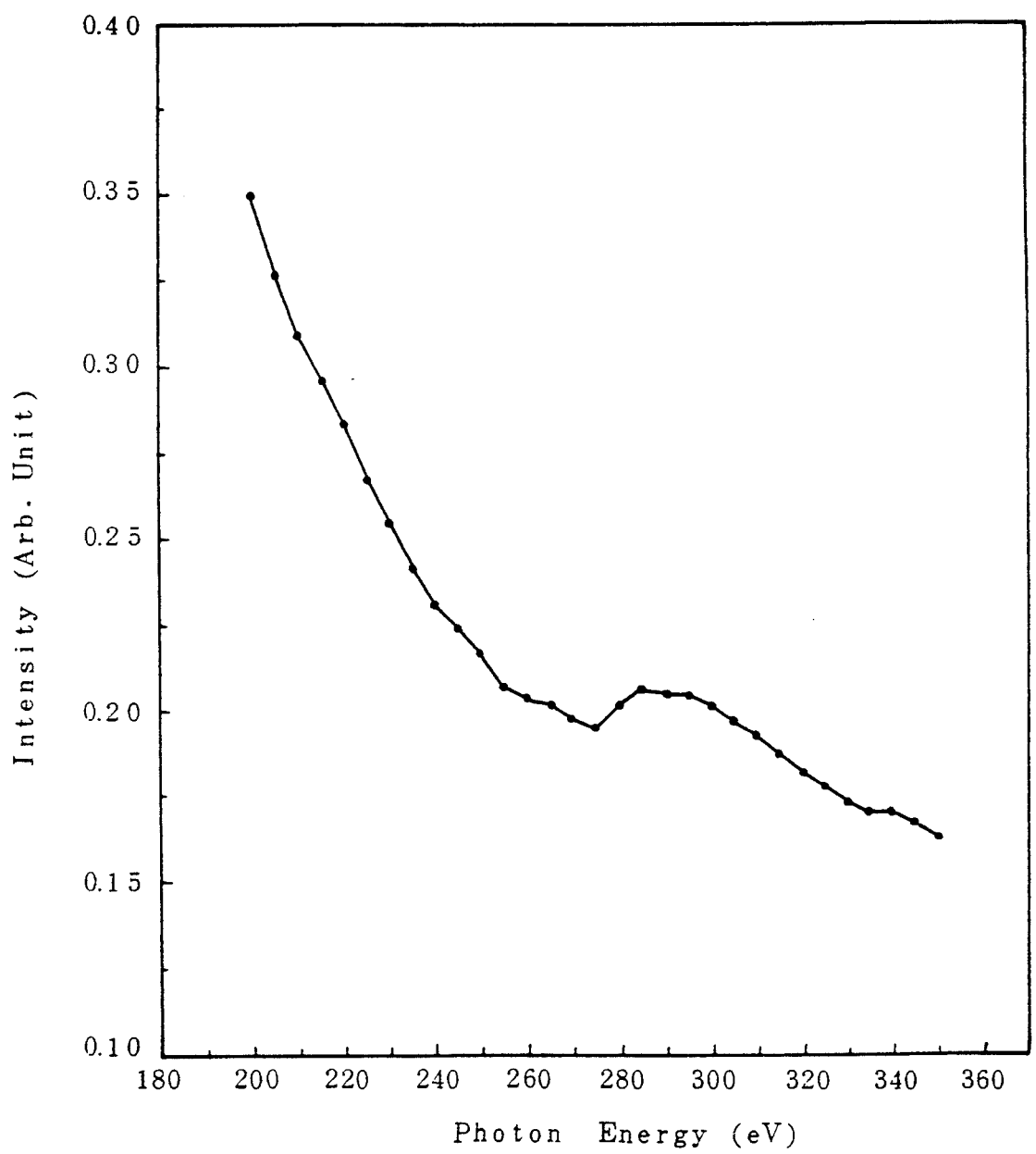
FIG. 8 is a graph showing a spectrum of total electron yield of the silicon carbide at an energy in the range between 3.5-6.2 nm (E=200-350 eV).

FIG. 8 shows the spectrum of total electron yield (E=200 eV-350 eV) measured in the proximity of the K shell absorption edge of C of the SiC substrate. Table 7 describes the ratio of quantum reaction efficiency on the basis of the result of the embodiment 2-6 and the ratio of total electron yield.

TABLE 7

| | Ratio of quantum reaction efficiency | Ratio of total electron yield |
| --- | --- | --- |
| Embodiment 2-5 | 2.1 | 0.95 |
| Embodiment 2-6 | 1 | 1 |

As compared with the embodiment 2-6, the embodiment 2-5 resulted in a slight decrease in the total electron yield but an increase in the quantum reaction efficiency of as much again. Consequently, in spite of the drop in the total electron yield of the entire SiC substrate, the quantum reaction efficiency was improved because the light of the embodiment 2-5 could excite the K shell electrons of constituent atoms C of the substrate. Accordingly, it can be appreciated that the radiation of light including the foregoing absorption edge band or the energy band barely higher than the absorption edge is necessary in order to enhance the etch rate.

[Embodiment 2-7]

1. Substrate sample: SiC
2. Substrate temperature: 25° C.
3. Reactive gases: Sulfur hexafluoride ($SF_6$) and Argon (Ar)
4. Gas pressure (gas pressure measured in the vicinity of the sample in the reactant chamber):

$SF_6$ ... 0.01 Torr

Ar ... 0.5 Torr

5. Output power of microwaves (in the gas plasma generation section): 30W
6. Excitation light: Soft X-rays having a wavelength between 0.6 and 100 nm
7. Dose of light: 20,000 min·mAmp. (84 min)
8. Mask: Nickel stencil mesh mask This experiment carried out under the conditions set forth in the above resulted in etching as follows.

| | Etched regions | Unetched mesa areas |
| --- | --- | --- |
| Etch rate | approx. 2.14 nm/min | — |
| Peak-to-valley height | approx. 180 nm | less than maximum measuring capacity |

[Embodiment 3]

1. Substrate sample: SiO$_2$
2. Substrate temperature: 25° C.
3. Reactive gases: Sulfur hexafluoride (SF$_6$) and Argon (Ar)
4. Gas pressure (gas pressure measured in the vicinity of the sample in the reactant chamber):

SF$_6$ ... 0.1 Torr

Ar ... 0.5 Torr

5. Output power of microwaves (in the gas plasma generation section): 30W
6. Excitation light: Soft X-rays having a wavelength between 0.6 and 100 nm
7. Dose of light: 20,000 min·mAmp. (91 min)
8. Mask: Nickel stencil mesh mask This experiment was carried out under the conditions set forth in the above and resulted in etching as follows.

|  | Etched regions | Unetched mesa areas |
|---|---|---|
| Etch rate | approx. 3.96 nm/min | — |
| Peak-to-valley height | approx. 360 nm | less than maximum measuring capacity |

[Embodiment 4]

1. Substrate sample: W
2. Substrate temperature: 25° C.
3. Reactive gases: Sulfur hexafluoride (SF$_6$) and Argon (Ar)
4. Gas pressure (gas pressure measured in the vicinity of the sample in the reactant chamber):
    SF$_6$ ... 0.05 Torr
    Ar ... 0.5 Torr
5. Output power of microwaves (in the gas plasma generation section): 30W
6. Excitation light: Soft X-rays having a wavelength between 0.6 and 100 nm
7. Dose of light: 10,000 min·Amp. (47 min)
8. Mask: Nickel stencil mesh mask This experiment was carried out under the conditions set forth in the above and resulted in etching as follows.

|  | Etched regions | Unetched mesa areas |
|---|---|---|
| Etch rate | approx. 2.34 nm/min | — |
| Peak-to-valley height | approx. 110 nm | less than maximum measuring capacity |

[Embodiment 5]

1. Substrate sample: Ta
2. Substrate temperature: 25° C.
3. Reactive gases: Sulfur hexafluoride (SF$_6$) and Argon (Ar)
4. Gas pressure (gas pressure measured in the vicinity of the sample in the reactant chamber):
    SF$_6$ ... 0.05 Torr
    Ar ... 0.5 Torr
5. Output power of microwaves (in the gas plasma generation section): 30W
6. Excitation light: Soft X-rays having a wavelength between 0.6 and 100 nm
7. Dose of light: 20,000 min·mAmp. (64 min)
8. Mask: Nickel stencil mesh mask This experiment was carried out under the conditions set forth in the above and resulted in etching as follows.

|  | Etched regions | Unetched mesa areas |
|---|---|---|
| Etch rate | approx. 4.69 nm/min | — |
| Peak-to-valley height | approx. 300 nm | less than maximum measuring capacity |

[Embodiment 6]

1. Substrate sample: WOx
2. Substrate temperature: 25° C.
3. Reactive gases: Sulfur hexafluoride (SF$_6$) and Argon (Ar)
4. Gas pressure (gas pressure measured in the vicinity of the sample in the reactant chamber):
    SF$_6$ ... 0.1 Torr
    Ar ... 0.5 Torr
5. Output power of microwaves (in the gas plasma generation section): 30W
6. Excitation light: Soft X-rays having a wavelength between 0.6 and 100 nm
7. Dose of light: 20,000 min·mAmp. (69 min)
8. Mask: Nickel stencil mesh mask This experiment was carried out under the conditions set forth in the above and resulted in etching as follows.

|  | Etched regions | Unetched mesa areas |
|---|---|---|
| Etch rate | approx. 6.52 nm/min | — |
| Peak-to-valley height | approx. 450 nm | less than maximum measuring capacity |

[Embodiment 7]

1. Substrate sample: TaOx
2. Substrate temperature: 25° C.
3. Reactive gases: Sulfur hexafluoride (SF$_6$) and Argon (Ar)
4. Gas pressure (gas pressure measured in the vicinity of the sample in the reactant chamber):
    SF$_6$ ... 0.01 Torr
    Ar ... 0.5 Torr
5. Output power of microwaves (in the gas plasma generation section): 30W
6. Excitation light: Soft X-rays having a wavelength between 0.6 and 100 nm
7. Dose of light: 20,000 min·Amp. (76 min)
8. Mask: Nickel stencil mesh mask This experiment was carried out under the conditions set forth in the above and resulted in etching as follows.

|  | Etched regions | Unetched mesa areas |
|---|---|---|
| Etch rate | approx. 5.26 nm/min | approx. 0.2 nm/min |
| Peak-to-valley height | approx. 400 nm | approx. 15 nm |

[Embodiment 8]

1. Substrate sample: TiOx
2. Substrate temperature: 25° C.
3. Reactive gases: Sulfur hexafluoride ($SF_6$) and Argon (Ar)
4. Gas pressure (gas pressure measured in the vicinity of the sample in the reactant chamber):
   $SF_6$ ... 0.01 Torr
   Ar ... 0.5 Torr
5. Output power of microwaves (in the gas plasma generation section): 30W
6. Excitation light: Soft X-rays having a wavelength between 0.6 and 100 nm
7. Dose of light: 20,000 min·Amp. (72 min)
8. Mask: Nickel stencil mesh mask This experiment was carried out under the conditions set forth in the above and resulted in etching as follows.

|  | Etched regions | Unetched mesa areas |
| --- | --- | --- |
| Etch rate | approx. 1.1 nm/min | — |
| Peak-to-valley height | approx. 80 nm | less than maximum measuring capacity |

Following are reference experiments of etching conducted without the excitation of reactive gases by means of microwaves.

[Reference 1]

1. Substrate sample: SiC
2. Substrate temperature: 25° C.
3. Reactive gases: Sulfur hexafluoride ($SF_6$) and Argon (Ar)
4. Gas pressure (gas pressure measured in the vicinity of the sample in the reactant chamber):
   $SF_6$ ... 0.1 Torr
   Ar ... 0.3 Torr
5. Excitation light: Light having a wavelength longer than 0.6 nm
6. Dose of light: 20,000 min·Amp. (103 min)
7. Mask: Nickel stencil mesh mask This experiment was carried out under the conditions set forth in the above and resulted in etching as follows.

|  | Etched regions | Unetched mesa areas |
| --- | --- | --- |
| Etch rate | approx. 0.146 nm/min | — |
| Peak-to-valley height | approx. 15 nm | less than maximum measuring capacity |

[Reference 2]

1. Substrate sample: $SiO_2$
2. Substrate temperature: 25° C.
3. Reactive gases: Sulfur hexafluoride ($SF_6$) and Argon (Ar)
4. Gas pressure (gas pressure measured in the vicinity of the sample in the reactant chamber):
   $SF_6$ ... 0.05 Torr
   Ar ... 0.5 Torr
5. Excitation light: Light having a wavelength longer than 0.6 nm
6. Dose of light: 20,000 min·Amp. (78 min)
7. Mask: Nickel stencil mesh mask This experiment was carried out under the conditions set forth in the above and resulted in etching as follows.

|  | Etched regions | Unetched mesa areas |
| --- | --- | --- |
| Etch rate | approx. 1.03 nm/min | — |
| Peak-to-valley height | approx. 80 nm | less than maximum measuring capacity |

[Reference 3]

1. Substrate sample: W
2. Substrate temperature: 25° C.
3. Reactive gases: Sulfur hexafluoride ($SF_6$) and Argon (Ar)
4. Gas pressure (gas pressure measured in the vicinity of the sample in the reactant chamber):
   $SF_6$ ... 0.05 Torr
   Ar ... 0.5 Torr
5. Excitation light: Light having a wavelength longer than 0.6 nm
6. Dose of light: 20,000 min·Amp. (85 min)
7. Mask: Nickel stencil mesh mask This experiment was carried out under the conditions set forth in the above and resulted in etching as follows.

|  | Etched regions | Unetched mesa areas |
| --- | --- | --- |
| Etch rate | approx. 0.06 nm/min | — |
| Peak-to-valley height | approx. 5 nm | less than maximum measuring capacity |

[Reference 4]

1. Substrate sample: Ta
2. Substrate temperature: 25° C.
3. Reactive gases: Sulfur hexafluoride ($SF_6$) and Argon (Ar)
4. Gas pressure (gas pressure measured in the vicinity of the sample in the reactant chamber):
   $SF_6$ ... 0.05 Torr
   Ar ... 0.5 Torr
5. Excitation light: Light having a wavelength longer than 0.6 nm
6. Dose of light: 20,000 min·Amp. (94 min)
7. Mask: Nickel stencil mesh mask This experiment was carried out under the conditions set forth in the above and resulted in etching as follows.

|  | Etched regions | Unetched mesa areas |
| --- | --- | --- |
| Etch rate | — | — |
| Peak-to-valley height | less than maximum measuring capacity | less than maximum measuring capacity |

[Reference 5]

1. Substrate sample: WOx
2. Substrate temperature: 25° C.
3. Reactive gases: Sulfur hexafluoride ($SF_6$) and Argon (Ar)
4. Gas pressure (gas pressure measured in the vicinity of the sample in the reactant chamber):
   $SF_6$ ... 0.1 Torr
   Ar ... 0.5 Torr 5. Excitation light: Light having a wavelength longer than 0.6 nm
6. Dose of light: 20,000 min·mAmp. (68 min)
7. Mask: Nickel stencil mesh mask This experiment was carried out under the conditions set forth in the above and resulted in etching as follows.

|  | Etched regions | Unetched mesa areas |
|---|---|---|
| Etch rate | approx. 0.15 nm/min | — |
| Peak-to-valley height | approx. 10 nm | less than maximum measuring capacity |

[Reference 6]
1. Substrate sample: TaOx
2. Substrate temperature: 25° C.
3. Reactive gases: Sulfur hexafluoride ($SF_6$) and Argon (Ar)
4. Gas pressure (gas pressure measured in the vicinity of the sample in the reactant chamber):
   $SF_6$ ... 0.01 Torr
   Ar ... 0.5 Torr
5. Excitation light: Light having a wavelength longer than 0.6 nm
6. Dose of light: 20,000 min·Amp. (84 min)
7. Mask: Nickel stencil mesh mask This experiment was carried out under the conditions set forth in the above and resulted in etching as follows.

|  | Etched regions | Unetched mesa areas |
|---|---|---|
| Etch rate | approx. 0.42 nm/min | — |
| Peak-to-valley height | approx. 35 nm | less than maximum measuring capacity |

[Reference 7]
1. Substrate sample: TiOx
2. Substrate temperature: 25° C.
3. Reactive gases: Sulfur hexafluoride ($SF_6$) and Argon (Ar)
4. Gas pressure (gas pressure measured in the vicinity of the sample in the reactant chamber):
   $SF_6$ ... 0.01 Torr
   Ar ... 0.5 Torr
5. Excitation light: Light having a wavelength longer than 0.6 nm
6. Dose of light: 20,000 min·mAmp. (80 min)
7. Mask: Nickel stencil mesh mask This experiment was carried out under the conditions set forth in the above and resulted in etching as follows.

|  | Etched regions | Unetched mesa areas |
|---|---|---|
| Etch rate | approx. 0.38 nm/min | — |
| Peak-to-valley height | approx. 30 nm | less than maximum measuring capacity |

As is evident from the above, the results of the reference experiments using merely light are inferior in the etch rate to those of the embodiments in which etching gases are excited by the microwaves.

Throughout the experiments for all embodiments, it is appropriate to select $SF_6$ and Ar at the pressures of 10 mTorr-100 mTorr and 500 mTorr, and the output level of microwaves in the range of 15-30 W.

This invention is applicable in the etching of other metal, insulating material, and material of semiconductor devices.

Several embodiments of the invention have now been described in detail. It is to be noted, however, that these descriptions of specific embodiments are merely illustrative of the principles underlying the inventive concept. It is contemplated that various modifications of the disclosed embodiments, as well as other embodiments of the invention will, without departing from the spirit and scope of the invention, be apparent to persons skilled in the art.

What is claimed is:

1. A dry etching method comprising introducing reactive gases activated by microwaves into a reactant chamber, and selectively etching target regions by the radiation of light to the target areas on a substrate, that is material to be etched, positioned in the reactant chamber, the light including a wavelength band for exciting inner shells of constituent atoms of the substrate, wherein the activated reactive gasses contact, and effect etching of, the substrate at locations which do not receive the light radiation and effect of greater degree of etching of the substrate at the target areas than at the locations which do not receive the light radiation.

2. A dry etching method according to claim 1, wherein the substrate is made of Si, and the light is soft X-rays having a wavelength of 12.5 nm or less.

3. A dry etching method comprising introducing reactive gases activated by microwaves into a reactant chamber, and selectively etching target regions by the radiation of light to the target areas on a substrate, that is material to be etched, positioned in the reactant chamber, the light including a wavelength band for exciting inner shells of constituent atoms of the substrate, and prior to selectively etching, placing a noncontact mask having openings defining the target regions above the substrate so that the mask is spaced from the substrate by a distance not greater than 380 μm.

4. A dry etching method according to claim 3, wherein the material is made of $SiO_2$, and the light is soft X-rays.

5. A dry etching method according to claim 3, wherein the material is made of W, and the light is soft X-rays.

6. A dry etching method according to claim 3, wherein the material is made of TiOx, and the light is soft X-rays.

7. A dry etching method according to claim 3, wherein the material is made of WOx, and the light is soft X-rays.

8. A dry etching method according to claim 3, wherein the material is made of TaOx, and the light is soft X-rays.

9. A dry etching method according to claim 3, wherein the substrate is made of SiC, and the light is soft X-rays having a wavelength of 10 nm or less.

10. A dry etching method according to claim 3 wherein the activated reactive gasses effect etching of the substrate substantially only at the target areas.

11. A dry etching method according to claim 3 comprising the preliminary step of activating the reactive gasses with microwaves before introducing those gasses into the reactant chamber.

12. A dry etching method according to claim 3 wherein the reactive gasses introduced into the chamber consist essentially of gasses capable of reacting with the substrate in the presence of the light to etch the substrate.

* * * * *